United States Patent
Wong (10) Patent No.: US 6,377,075 B1
(45) Date of Patent: Apr. 23, 2002

(54) HIGH VOLTAGE PROTECTION CIRCUIT ON STANDARD CMOS PROCESS

(75) Inventor: Louis Sze Yuen Wong, Pymble (AU)

(73) Assignee: Cochlear Limited, Lane Cove (AU)

( * ) Notice: Subject to any disclaimer, the term of this patent is extended or adjusted under 35 U.S.C. 154(b) by 0 days.

(21) Appl. No.: 09/428,968

(22) Filed: Nov. 4, 1999

(30) Foreign Application Priority Data

Jun. 29, 1999 (AU) .................... PCT/AU99/00519

(51) Int. Cl.[7] ......................................... H03K 19/0185
(52) U.S. Cl. ........................................ 326/83; 326/81
(58) Field of Search ........................ 326/80, 81, 83, 326/86, 63, 68

(56) References Cited

U.S. PATENT DOCUMENTS

| | | | |
|---|---|---|---|
| 4,508,978 A | | 4/1985 | Reddy |
| 5,136,190 A | * | 8/1992 | Chern et al. ............... 326/81 |
| 5,440,249 A | * | 8/1995 | Schucker et al. .......... 326/81 |
| 5,892,371 A | * | 4/1999 | Malet ........................ 326/81 |
| 6,064,227 A | * | 5/2000 | Saito ......................... 326/83 |
| 6,099,100 A | * | 8/2000 | Lee ........................... 326/81 |
| 6,130,557 A | * | 10/2000 | Drapkin et al. ............ 326/81 |

FOREIGN PATENT DOCUMENTS

EP        0 171 495        2/1986

OTHER PUBLICATIONS

IEEE Journal of Solid–State Circuits, vol. 31, No. 7, Jul. 1996, Design Considerations for CMOS Digital Circuits with Improved Hot–Carrier Reliability, Author: Leblebici, Yusuf Publisher's Item Identifier: 0018–9200(96)04447–2.

\* cited by examiner

*Primary Examiner*—Don Phu Le
(74) *Attorney, Agent, or Firm*—Gottlieb, Rackman & Reisman, P.C.

(57) ABSTRACT

There is disclosed a circuit topology for avoiding transistor gate oxide- dielectric breakdown and hot-carrier degradation in circuits, such as CMOS inverters, fabricated in a standard sub-micron CMOS process with feature size below 0.8 $\mu$m and gate-oxide thickness less than 150 Å. An inverter circuit according to the invention incorporates transistors M6, M2, M3, M5 appropriately biased, additional to those of a standard inverter circuit (comprising M1 and M4), in order to avoid hot-carrier degradation and gate-oxide breakdown of M4 and M1. The invention is also applicable to transistor circuits having other functionalities for example logic level translators.

37 Claims, 7 Drawing Sheets

HIGH VOLTAGE PROTECTION CIRCUIT ON STANDARD CMOS PROCESS

FIELD OF THE INVENTION

The present invention is concerned with an electronic circuit that facilitates high voltage long term reliable operation of transistors in a standard low-voltage, sub-micron, complementary metal oxide semiconductor (CMOS) process.

BACKGROUND

In conventional CMOS circuits it frequently happens that during normal operation the maximum gate-source, gate-drain or drain-source voltages of the n-channel and p-channel transistors are sometimes substantially equal to the supply voltage. For example, such a situation occurs when operating a standard CMOS inverter. When transistors are fabricated in a standard sub-micron CMOS process (for example, with feature size below 0.8 µm and gate-oxide thickness less than 150 Å), and the supply voltage is sufficiently large (for example, over 5V), both n-channel and p-channel transistors suffer from hot-carrier degradation and gate-drain/gate-source overlap oxide breakdown While such effects can be avoided by either decreasing the supply voltage, or using a larger dimension fabrication process, it is frequently inconvenient to do either. For example it may be that only one supply rail is readily available or that space constraints require a sub-micron process.

In U.S. Pat. No. 5,726,589 there is described an output driver circuit for a semiconductor chip in which an N-channel transistor is protected from hot-carrier degradation by delaying the "turning on" of the transistor until the drain-source voltage has dropped below the characteristic hot-electron operation voltage. However, such a circuit does not protect its transistors (both P-channel and N-channel) from gate-oxide dielectric breakdown under high voltage stress.

In U.S. Pat. No. 5,369,312 a circuit technique is disclosed by which an N-channel transistor is protected from hot-carrier degradation by connecting two transistors in cascode with a third transistor to bias the intermediate node voltage roughly mid-way between the full supply voltage. However the circuit disclosed does not provide protection against gate-oxide breakdown under high voltage stress.

In U.S. Pat. No. 4,967,103 a circuit is described for avoiding hot-carrier degradation in a N-channel to N-channel push-pull inverter. Once again though, the circuit does not address the problem of gate-oxide dielectric breakdown.

It is an object of the present invention to provide a CMOS transistor circuit which avoids gate-oxide dielectric breakdown and preferably hot carrier degradation for both N and P transistors.

SUMMARY OF THE INVENTION

The present invention provides, in an electrical circuit fabricated using a sub-micron CMOS process of the type incorporating a first at least one CMOS transistor having a gate connected to a node taking a range of voltages and susceptible to hot carrier degradation and gate-oxide dielectric breakdown when operated at a first voltage level, the improvement comprising; connected between said gate and said node a second transistor biased at a voltage less than said first voltage level in an arrangement reducing the maximum voltage across the gate of said first transistor during operation of said circuit thereby avoiding said gate-oxide dielectric breakdown when operated at said first voltage level.

Preferably said improvement further comprises a third transistor biased and connected to a non-gate terminal of said first transistor in an arrangement avoiding said hot carrier degradation of said first transistor.

According to a further aspect of the invention there is provided in a CMOS inverter circuit designed for powering by a first voltage rail at potential Vdd and a second voltage rail at potential Vss being less than Vdd and having a first transistor of a first channel type connected to one of said first and second voltage rails and a second transistor of a complementary channel type connected to the other of said first and second voltage rails, the drain terminals of said first and second transistors connected to each other thereby forming an output node and the gates of said first and second transistors connected to each other thereby forming an input node and wherein upon applying voltage transitions between Vdd and Vss to said input node, said first and second transistors are subjected to gate-oxide dielectric breakdown and hot carrier degradation, the improvement comprising:

a third transistor of the same channel type connected between the gate of said first transistor and said input node, said third transistor having a gate biased at a voltage between Vss and Vdd thereby avoiding said gate-oxide dielectric breakdown of said first transistor.

Preferably said improvement further comprises a fourth transistor connected between the drain of said second transistor and said output node, said fourth transistor having a gate biased at a voltage between Vss and Vdd thereby avoiding said hot carrier degradation of said first transistor.

Preferably said improvement further comprises a fifth transistor connected between the drain of said first transistor and said output terminal, said fifth transistor having a gate biased at a voltage between Vss and Vdd thereby avoiding said hot carrier degradation of said first transistor.

DETAILED DESCRIPTION

The present invention will be explained as applied to a CMOS inverter, however it will be understood that the invention may also be applied to other types of transistor circuit having components which are liable to gate-oxide dielectric breakdown and hot carrier degradation.

Figure 1:
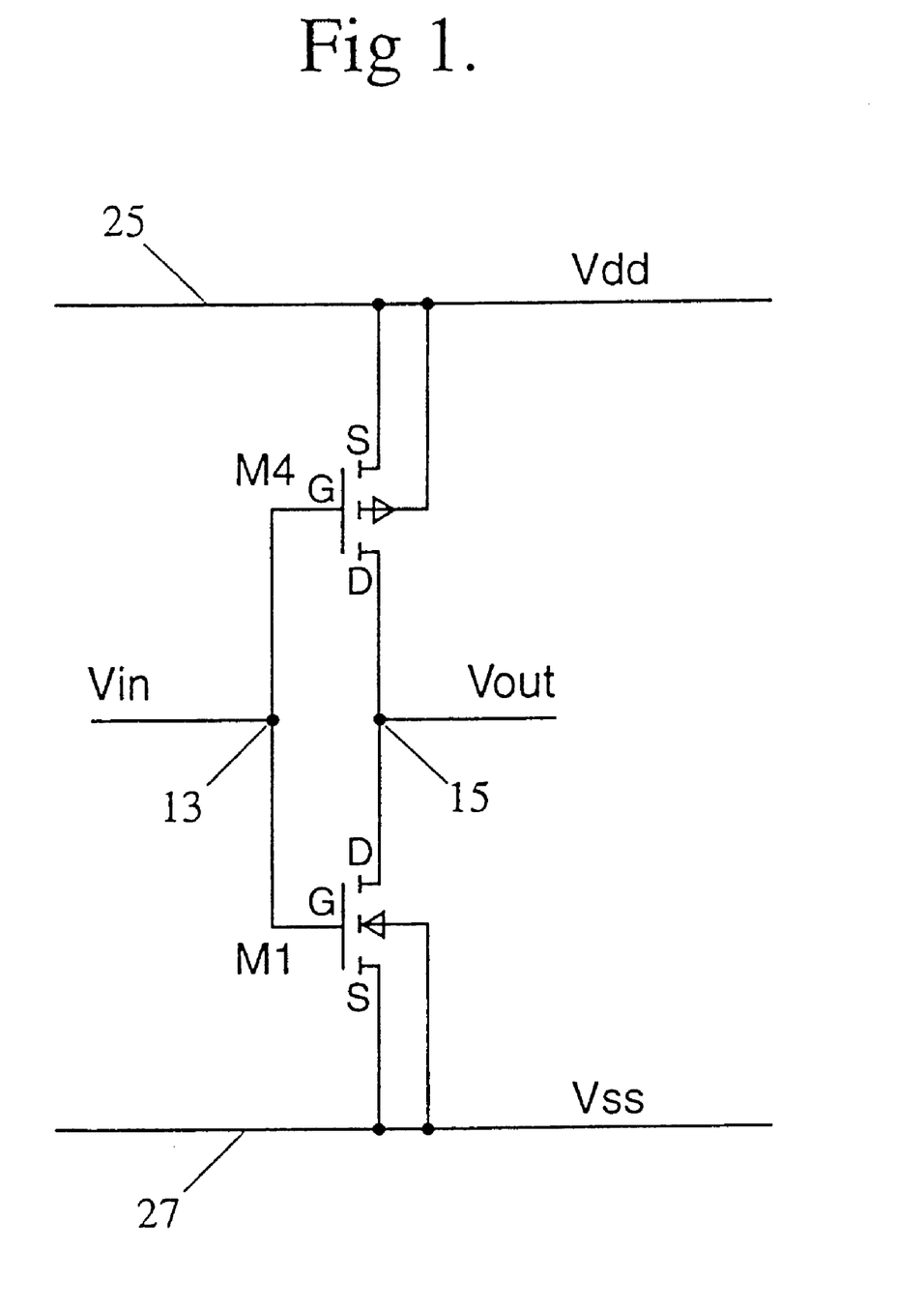
FIG. 1 is a circuit diagram of a prior art CMOS inverter circuit.

Referring now to FIG. 1 a conventional CMOS inverter is depicted consisting of PMOS (M4) and NMOS (M1) transistors connected as shown. The operation of such a circuit is well known and will not be described in detail. Briefly however, the input node 13 and output node 15 of the inverter take one of two logic states : logic 1 and logic 0. For example, if the input is at logic 1, then Vin, the voltage applied to input node 13 is set equal to Vdd. Similarly, at logic 0, Vin is set equal to Vss, Vss typically being 0V. The gate-source, gate-drain and drain-source voltages of both transistors are equal to the voltages Vdd or Vss on voltage rails 25 and 27, depending on the logical state of the inverter. If the inverter is operating under a high supply voltage, say 10V, and is fabricated by means of a small-dimension process, for example 0.6 μm, then both transistors will experience hot carrier degradation and gate-oxide dielectric breakdown due to the high gate-source, gate-drain and drain-source voltages. In particular, upon applying a voltage of Vin=Vdd to input node 13 then the P-channel transistor M4 will turn off while the N-channel transistor M1 will switch on. Accordingly, substantially the entire voltage rail will be placed across M4 so that hot carrier degradation may occur during subsequent transitions from one logic state to another. Furthermore a similar voltage will be present across the gate-source of M1 and the gate-drain of M4 so that there is a risk of gate-oxide dielectric breakdown Referring now to FIG. 2 an inverter circuit incorporating the present invention is shown. Six transistors (three NMOS M1, M3, M5 and three PMOS M4, M2, M6) are used to form the inverter. Similar to the conventional inverter, input and output nodes 13,15 take one of two logical states, logic 1 and logic 0. As before, logic 1 is equal to Vdd and logic 0 is equal to Vss. It will be assumed that in the circuit of FIG. 2 Vdd=10V Vss=0V, and that the ngate and pgate voltages on nodes 17, 19 are set to half Vdd, i.e. 5V. The threshold voltages of the NMOS and PMOS transistors are Vthn=0.5V and Vthp=−0.5V, respectively. It is assumed that Vin=0V and Vout=10V initially. In the event that the voltage Vin on input node 13 makes a transition from logic 0 to logic 1, i.e. Vin changes from 0V to 10V, then transistor M5 (NMOS) is turned on and pulls up node tgn 21 until it reaches a voltage of ngate-Vthn=4.5V. When tgn=4.5V or above, the gate-source voltage of M5 is below its threshold voltage, therefore M5 is turned off and hence tgn stays at around 4.5V. Now the gate-source voltage of transistor M1 (NMOS) is 4.5V, M1 is turned on and pulls node tn 23 towards Vss. Consequently when tn approaches Vss, transistor M3 (NMOS) turns on and pulls Vout to Vss, i.e. Vout≈Vss, which is logic 0. On the upper side of the inverter, the gate-source voltage of transistor M6 (PMOS) is −5V, so M6 is turned on and pulls up node tgp 29 to Vdd. When tgp eventually reaches Vdd, the gate-source voltage of M4 (PMOS) is zero and M4 is turned off. As a result, node tp 31 will be pulled down through the action of transistor M2 (PMOS) until tp reaches 5.5V. At tp=5.5V, the gate-source voltage of M2 is below its threshold voltage and therefore it is turned off and hence tp stays at 5.5V.

Figure 2:
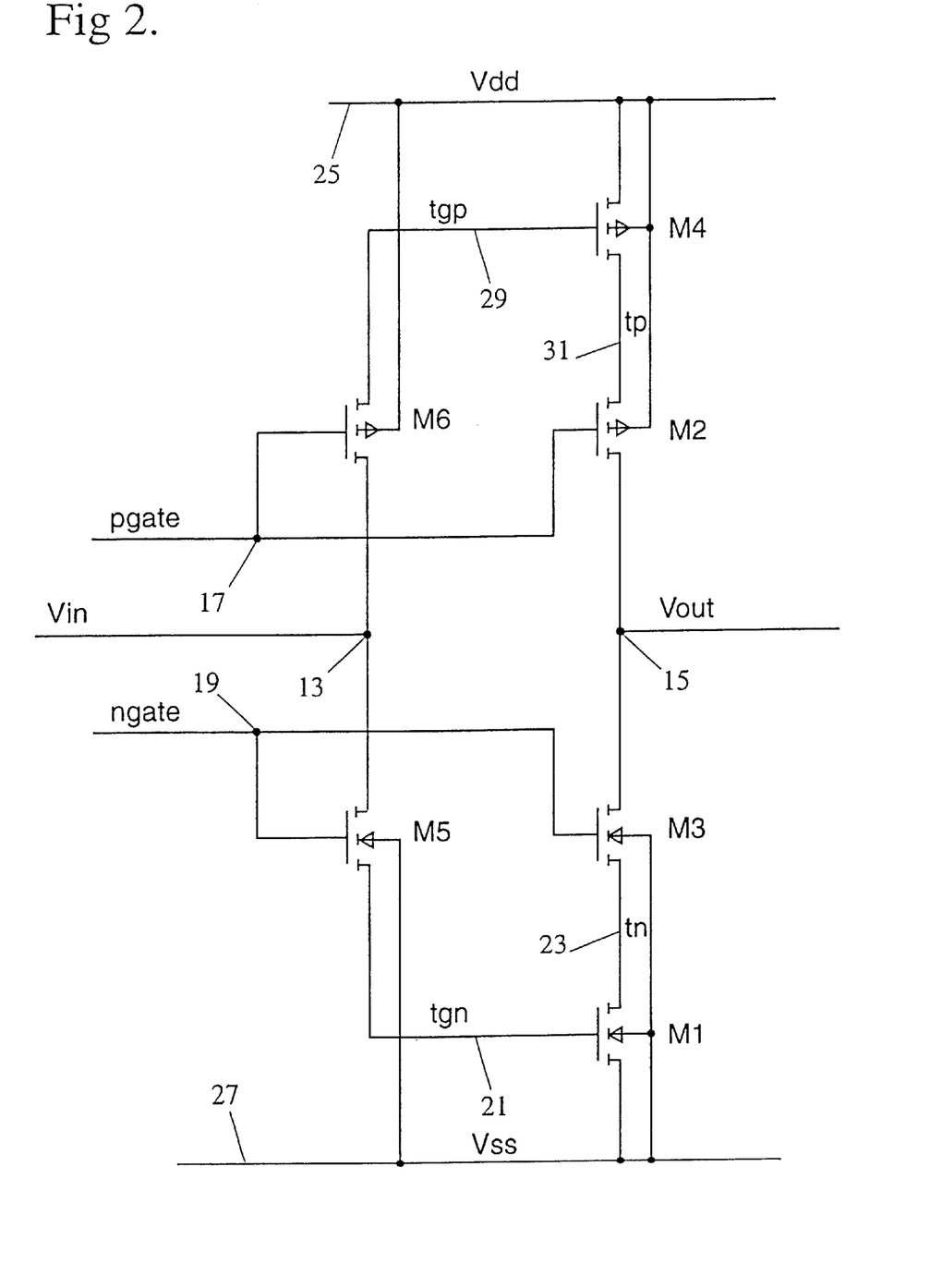
FIG. 2 is a circuit diagram of an inverter circuit incorporating hot carrier degradation and gate-oxide breakdown protection circuitry according to the present invention.

The operation of the device is similar upon the input making a transition from logic 1 to logic 0.

As described above, the maximum gate-source, gate-drain and drain-source voltage of the transistors is limited to about 5.5V. In contrast to the conventional CMOS inverter wherein the maximum gate-source, gate-drain and drain-source voltages is 10V. In other words, the electrical stress is approximately halved, hence both hot carrier degradation and gate-oxide dielectric breakdown are significantly reduced.

Figure 3:
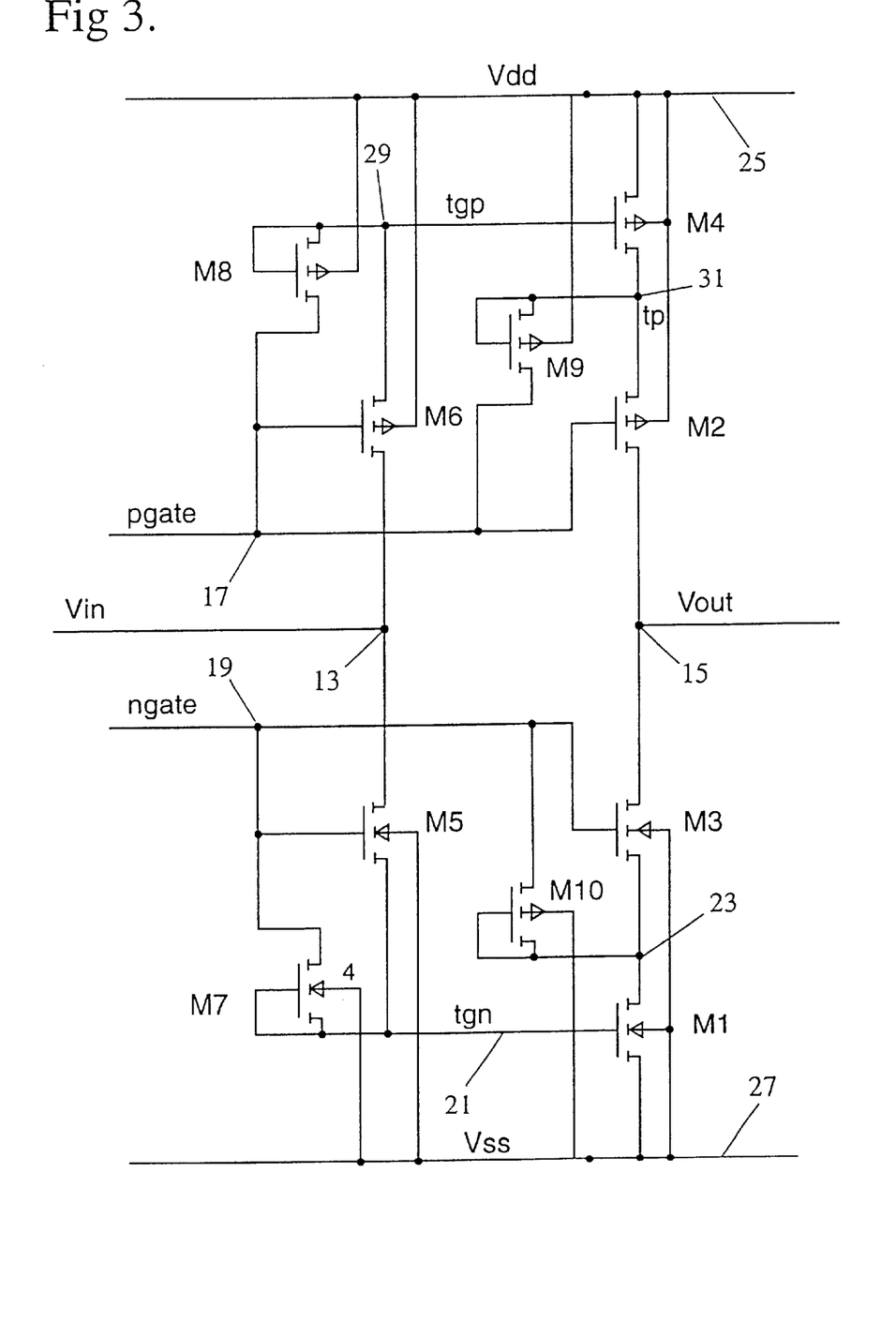
FIG. 3 is a circuit diagram of the circuit shown in FIG. 2 further incorporating circuitry for preventing node voltage drift as provided in a preferred embodiment of the present invention.

One disadvantage with the circuit described in FIG. 2 is that some second-order effects, such as sub-threshold leakage current and diffusion-substrate junction leakage current may affect its performance. The leakage current may cause some of the node voltages to drift far away from their normal operating points thereby degrading the high voltage protection. For example, if Vin=10V and Vout=0V, then tp may drift toward 0V if the sub-threshold leakage current in M2 is significant. If tp has drifted down to 0V then the drain-source voltage of M4 is equal to 10V. As a result, M4 experiences severe hot carrier degradation and gate oxide voltage stress. In order to prevent and overcome this problem, four additional transistors (two PMOS M8, M9 and two NMOS M7, M10) are inserted into the inverter as shown in FIG. 3. The purpose of the additional transistors is to prevent the voltages tp, tgp, tn and tgn on nodes 31, 29, 23, 21 respectively from drifting beyond their normal operating points. Using the previous example, where Vin=10V and Vout=0V, node 31 is pulled down due to the leakage current in M4. However, as soon as voltage tp on node 31 falls below approximately 4.5V (ie. one p threshold voltage below the voltage on node pgate), transistor M9 (PMOS) is turned on. Thus, node 31 remains at about 4.5V even when the leakage current in M4 is significant. Therefore, the drain-source voltage of M4 is equal to 5.5V instead of 10V, and the circuit continues to avoid hot carrier degradation and dielectric breakdown of its transistors. It will be noted that transistors M7–M10 are usually turned off during normal operation, they are only activated when any of the transistor leakage currents become significant. It will be understood by those skilled in the art that M7–M10 could be replaced by shottky or bipolar diodes or bipolar transistors or even high value resistors while maintaining the same protective function. In the event that resistors were used then the value of any one of the resistors is selected to be low enough to clamp the voltage at the node but preferably to be as high as possible subject to the previous requirements as any excess current which passes through one of the transistors would represent a power wastage.

Figure 4:
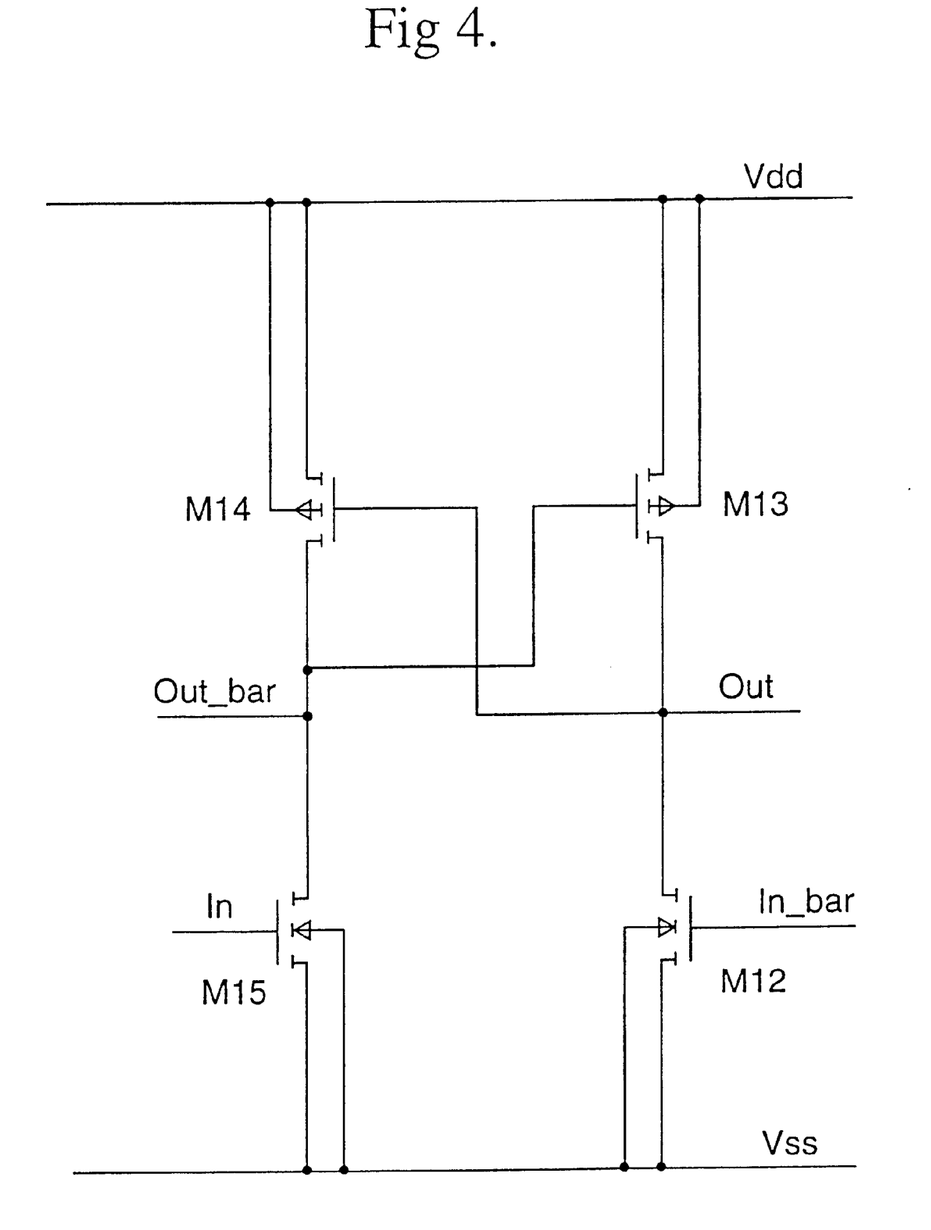
FIG. 4 is a circuit diagram of a prior art level translator circuit.
Figure 5:
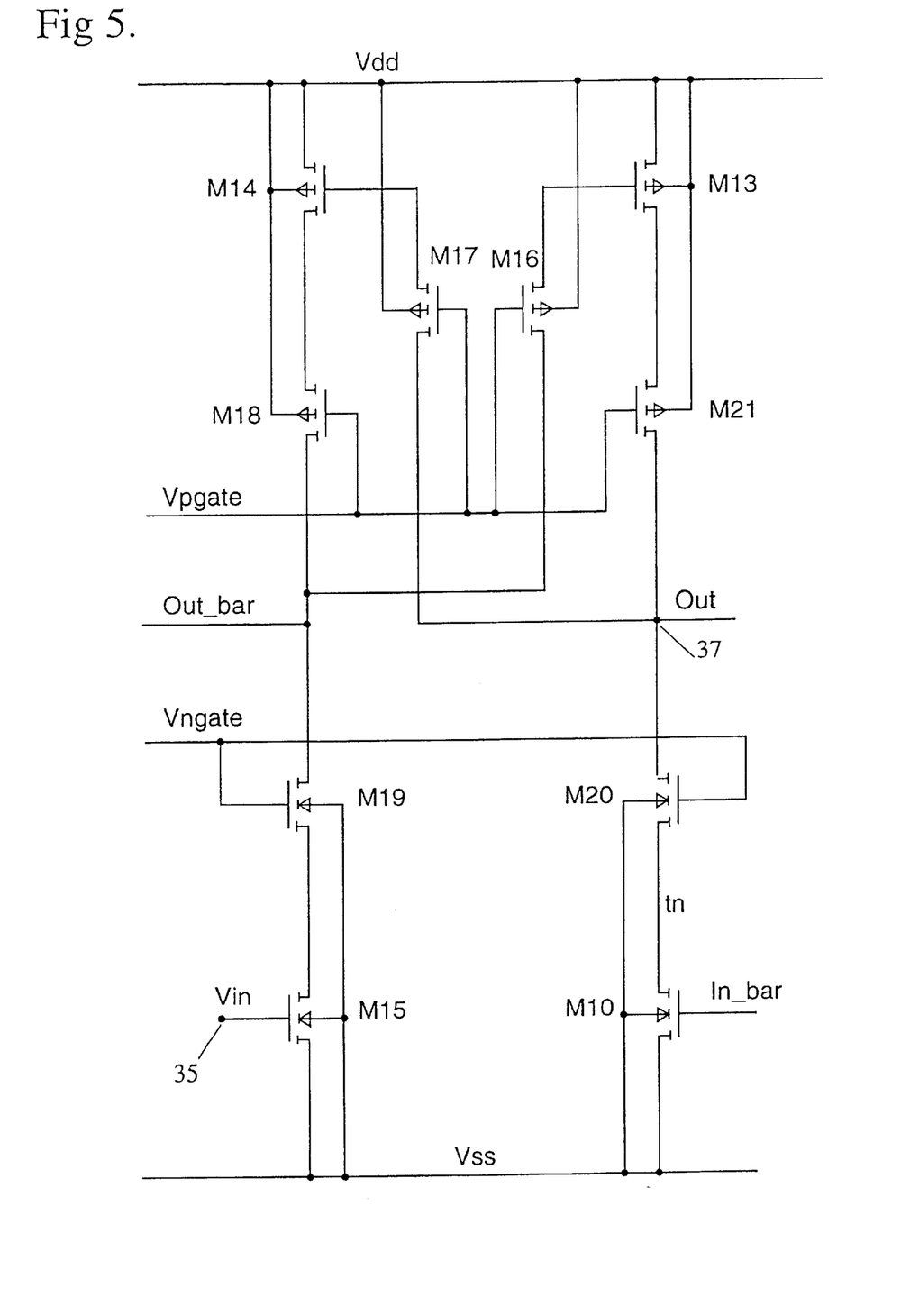
FIG. 5 is a circuit diagram of a high voltage level translator circuit incorporating hot carrier degradation and gate-oxide breakdown protection circuitry according to the present invention.

While the invention has been described with reference to an inverter circuit it will be realised that other circuits incorporating the invention are possible. For example, with reference to FIG. 4 there is depicted a standard digital logic level translator. The inputs "in" and "in$_{13}$ bar" are low voltage digital signals, for example 1.5V. The input signals are translated into an inverted "out_bar" and non-inverted "out" signals with full supply swing (say 10V). Referring now to FIG. 5 a digital logic level translator incorporating the present invention is shown. In this circuit Vdd could be 10V and Vpgate=Vngate=5V. A Vin swing of 0 to 1.5V on node 35 being translated to a swing of 0 to 10V at Out node 37. According to the invention M3–M6 M20, M21, M19, M18 operate to reduce the maximum drain-source voltage in order to avoid the hot-carrier degradation which would otherwise occur, while M16 and M17 operate to reduce the maximum gate-source voltage thereby preventing gate-oxide breakdown at M13 and M14.

Figure 6:
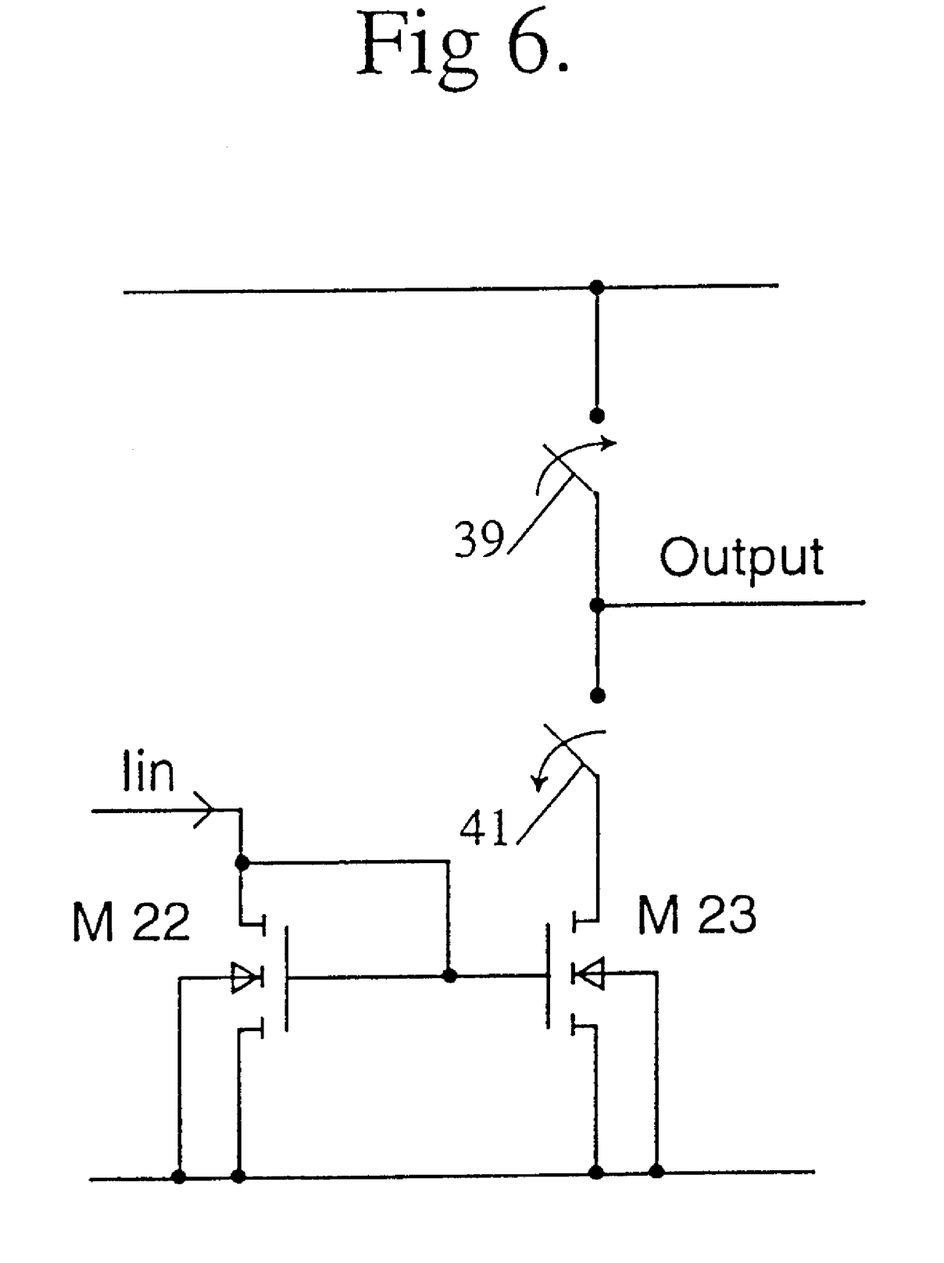
FIG. 6 is a circuit diagram of an output electrode driver as might be used in an electrical tissue stimulating therapeutic device.
Figure 7:
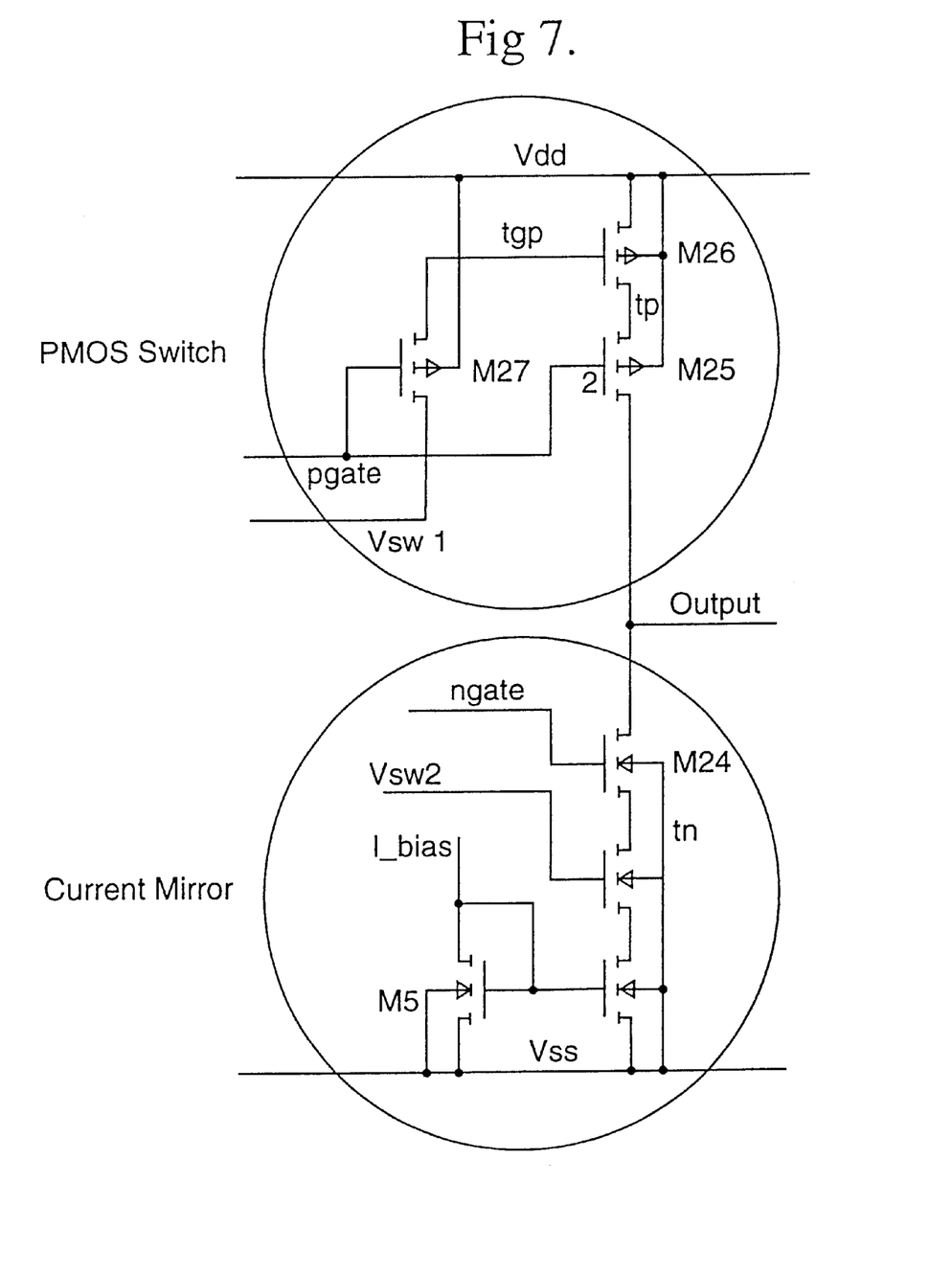
FIG. 7 is a circuit diagram of an implementation of the circuit of FIG. 6 further incorporating hot carrier degradation and gate-oxide breakdown circuitry according to the present invention.

Referring now to FIG. 6, there appears a diagram of a typical electrode output driver circuit as might be used in the output stage of an electrical tissue stimulator device such as a cochlear implant prosthesis. The driver circuit has two switches 39, 41 and a current source formed by current minor comprising transistors M22, M23. According to the invention the switching circuit of FIG. 6 may be implemented as shown in FIG. 7 where M24 and M25 have been used to reduce the maximum drain-source voltage, thereby avoiding hot-carrier degradation, while M27 has been incorporated to reduce the maximum gate-source voltage of M26 thereby avoiding gate-oxide dielectric breakdown. In the interests of clarity additional transistors which might be used to protect against second order effects in a similar manner to those of M7–M10 of FIG. 3 have not been shown in either of FIGS. 5 and 7. Nevertheless it will be understood by those skilled in the art that such circuitry may be included.

Although the invention has been described with reference to preferred embodiments, it is to be understood that these are merely illustrative of the application of the principles of the invention. Accordingly, the embodiments described in particular should be considered exemplary, not limiting with respect to the following claims.

What is claimed is:

1. In an electrical circuit fabricated using a sub-micron CMOS process of the type incorporating a first at least one CMOS transistor having a gate connected to a node taking a range of voltages and susceptible to hot carrier degradation and gate-oxide dielectric breakdown when operated at a first voltage level, the improvement comprising; connected between said gate and said node a second transistor biased at a voltage less than said first voltage level in an arrangement reducing the maximum voltage across the gate of said first transistor during operation of said circuit thereby avoiding said gate-oxide dielectric breakdown when operated at said first voltage level:

wherein a source terminal of said second transistor is connected to the gate of said first transistor; and wherein a resistor is connected between the gate and source of said second transistor said resistor being of a value selected to prevent node drift due to leakage current of said second transistor.

2. An electrical circuit according to claim 1, further comprising a third transistor biased and connected to a non-gate terminal of said first transistor in an arrangement avoiding said hot carrier degradation of said first transistor.

3. A circuit according to claim 1, wherein said circuit is further configured as a level translator circuit.

4. An electrical circuit according to claim 1, wherein a semiconductor device is connected between the gate and source of said second transistor in an arrangement preventing node drift due to leakage current of said second transistor.

5. An electrical circuit according to claim 4, wherein said semiconductor device comprises one of a shottky diode, CMOS transistor, bipolar diode or bipolar transistor.

6. A circuit according to claim 1, wherein said circuit is further configured as a switchable current source.

7. In a CMOS inverter circuit designed for powering by a first voltage rail at potential Vdd and a second voltage rail at potential Vss being less than Vdd and having a first transistor of a first channel type connected to one of said first and second voltage rails and a second transistor of a complementary channel type connected to the other of said first and second voltage rails, the drain terminals of said first and second transistors connected to each other thereby forming an output node and the gates of said first and second transistors connected to each other thereby forming an input node and wherein upon applying voltage transitions between Vdd and Vss to said input node, said first and second transistors are subjected to gate-oxide dielectric breakdown and hot carrier degradation, the improvement comprising:

a third transistor of the same channel type as said first transistor connected between the gate of said first transistor and said input node, said third transistor having a gate biased at a voltage between Vss and Vdd thereby avoiding said gate-oxide dielectric breakdown of said first transistor: and a fourth transistor of the same channel type as the second transistor, connected between the gate of said second transistor and said input terminal, said fourth transistor having a gate biased at a voltage between Vss and Vdd thereby avoiding said gate-oxide dielectric breakdown of said second transistor.

8. A circuit according to claim 7 further comprising:

a fifth transistor connected between the drain of said first transistor and said output node, said fifth transistor having a gate biased at a voltage between Vss and Vdd thereby avoiding said hot carrier degradation of said first transistor.

9. A circuit according to claim 8 further comprising:

a sixth transistor connected between the drain of said second transistor and said output node, said sixth transistor having a gate biased at a voltage between Vss and Vdd thereby avoiding said hot carrier degradation of said second transistor.

10. A circuit according to claim 9 further comprising:

a seventh semiconductor device connected between the gate and source of any one of the third, fifth, fourth and sixth transistors thereby preventing node drift due to leakage current of said one of the third, fourth, fifth and sixth transistors.

11. A circuit according to claim 9 further comprising:

a resistor connected between the gate and source of any one of the third, fifth, fourth and sixth transistors said resistor being of a value selected to prevent node drift due to leakage current of said one of the third, fourth, fifth and sixth transistors.

12. A circuit according to claim 10, wherein said seventh semiconductor device comprises any one of a shottky diode, CMOS transistor, a bipolar diode, a bipolar transistor.

13. A CMOS integrated circuit formed on a semiconductor substrate comprising:

a first transistor having a gate;

an input node connected to receive an input signal having a voltage range that extends from a reference voltage level to a relatively high voltage level;

a second transistor having a first terminal connected to a gate of the first transistor, a second terminal connected to the input node to receive the input signal, and a gate connected to a biasing voltage source, whereby a biasing voltage level of said biasing voltage source is between the reference voltage level and the relatively high voltage level thus preventing a maximum voltage developed between the gate and a source of the first transistor and the gate and drain of the first transistor from exceeding said voltage range, thereby avoiding gate oxide breakdown; and a first resistor connected between the gate and the first terminal of said second transistor, said first resistor being of a value selected to prevent node drift due to leakage current of said second transistor.

14. The CMOS integrated circuit of claim 13 further comprising:

a third transistor having a gate connected to the biasing voltage source, a first terminal connected to a nongate terminal of the first transistor and a second terminal connected to an output terminal, whereby said third transistor as biased prevents the maximum voltage developed between the source of the first transistor and the drain of the first transistor from exceeding said voltage range, thereby preventing hot carrier degradation of said first transistor.

15. The CMOS integrated circuit of claim 13 wherein the first terminal of the second transistor is a source and the second terminal of the second transistor is a drain.

16. The CMOS integrated circuit of claim 13 wherein a first semiconductor device is connected between the gate and the first terminal of said second transistor in an arrangement preventing node drift due to leakage current of said second transistor.

17. The CMOS integrated circuit of claim 16 wherein said first semiconductor device comprises one of a schottky diode, CMOS transistor, bipolar diode or bipolar transistor.

18. The CMOS integrated circuit of claim 14 wherein a second semiconductor device is connected between the gate and the first terminal of said third transistor in an arrangement preventing node drift due to leakage current of said third transistor.

19. The CMOS integrated circuit of claim 18, wherein said second semiconductor device comprises one of a schottky diode, CMOS transistor, bipolar diode or bipolar transistor.

20. The CMOS integrated circuit of claim 14, wherein a second resistor is connected between the gate and the first terminal of said third transistor said second resistor being of a value selected to prevent node drift due to leakage current of said third transistor.

21. A CMOS integrated circuit formed on a semiconductor substrate comprising:
   a first transistor having a gate;
   an input node connected to receive an input signal having a voltage range that extends from a reference voltage level to a relatively 20 high voltage level;
   a second transistor having a first terminal connected to a gate of the first transistor, a second terminal connected to the input node to receive the input signal, and a gate connected to a biasing voltage source, whereby a biasing voltage level of said biasing voltage source is between the reference voltage level and the relatively high voltage level thus preventing a maximum voltage developed between the gate and a source of the first transistor and the gate and drain of the first transistor from exceeding said voltage range, thereby avoiding gate oxide breakdown;
   a third transistor having a gate connected to the biasing voltage source, a first terminal connected to a nongate terminal of the first transistor and a second terminal connected to an output terminal, whereby said third transistor as biased prevents the maximum voltage developed between the source of the first transistor and the drain of the first transistor from exceeding said voltage range, thereby preventing hot carrier degradation of said first transistor:
   a first resistor is connected between the gate and the first terminal of said second transistor said resistor being of a value selected to prevent node drift due to leakage current of said second transistor.

22. The CMOS integrated circuit of claim 21 wherein the first terminal of the second transistor is a source and the second terminal of the second transistor is a drain.

23. The CMOS integrated circuit of claim 21 wherein a first semiconductor device is connected between the gate and the first terminal of said second transistor in an arrangement preventing node drift due to leakage current of said second transistor.

24. The CMOS integrated circuit of claim 23, wherein said first semiconductor device comprises one of a schottky diode, CMOS transistor, bipolar diode or bipolar transistor.

25. The CMOS integrated circuit of claim 21 wherein a second semiconductor device is connected between the gate and the first terminal of said third transistor in an arrangement preventing node drift due to leakage current of said third transistor.

26. The CMOS integrated circuit of claim 25, wherein said second semiconductor device comprises one of a schottky diode, CMOS transistor, bipolar diode or bipolar transistor.

27. The CMOS integrated circuit of claim 21, wherein a second resistor is connected between the gate and the first terminal of said third transistor said first resistor being of a value selected to prevent node drift due to leakage current of said third transistor.

28. A CMOS inverter circuit connected between a first power supply voltage source and second power supply voltage source, whereby said second power supply voltage source has a voltage level less than the first power supply voltage source, comprising:
   a first transistor of a first channel type connected to one of said first and second power supply voltage sources;
   a second transistor of a complementary channel type connected to the other of said power supply voltage sources,
   whereby drain terminals of said first and second transistors are connected to each other thereby forming an output node and the gates of said first and second transistors connected to each other thereby forming an input node and wherein upon applying an input signal having voltage levels that extend between the voltage levels of said first and second power supply voltage source to said input node, said first and second transistors are subjected to gate-oxide dielectric breakdown and hot carrier degradation;
   a third transistor of the same channel type as said first transistor connected between the gate of said first transistor and said input node, said third transistor having a gate connected to a biasing voltage source having a voltage level between the voltage level of the first power supply voltage source and the second power supply voltage source, thereby avoiding said gate-oxide dielectric breakdown of said first transistor.

29. The circuit of claim 28 further comprising:
   a fourth transistor of the same channel type as the second transistor, connected between the gate of said second transistor and said input terminal, said fourth transistor having a gate connected to the biasing voltage source thereby avoiding said gate-oxide dielectric breakdown of said second transistor.

30. The circuit of claim 29 further comprising:
   a fifth transistor connected between the drain of said first transistor and said output node, said fifth transistor having a gate connected to the biasing voltage source thereby avoiding said hot carrier degradation of said first transistor.

31. The circuit of claim 30 further comprising:
   a sixth transistor connected between the drain of said second transistor and said output node, said sixth transistor having a gate connected to the biasing voltage source thereby avoiding said hot carrier degradation of said second transistor.

32. The circuit of claim 31 further comprising:
   a semiconductor device connected between the gate and source of any one of the third, fifth, fourth and sixth transistors thereby preventing node drift due to leakage current of said one of the third, fourth, fifth and sixth transistors.

33. The circuit of claim 31 further comprising:
a resistor connected between the gate and source of any one of the third, fifth, fourth and sixth transistors said resistor being of a value selected to prevent node drift due to leakage current of said one of the third, fourth, fifth and sixth transistors.

34. The circuit of claim 32, wherein said semiconductor device comprises any one of a schottky diode, CMOS transistor, a bipolar diode, a bipolar transistor.

35. An electrical circuit according to claim 32, wherein a second semiconductor device is connected between the gate and source of said third transistor in an arrangement preventing node drift due to leakage current of said second transistor.

36. An electrical circuit according to claim 35, wherein said second semiconductor device comprises one of a shottky diode, CMOS transistor, bipolar diode or bipolar transistor.

37. An electrical circuit according to claim 32, wherein a second resistor is connected between the gate and source of said third transistor said second resistor being of a value selected to prevent node drift die to leakage current of said third transistor.

* * * * *